United States Patent
Faska et al.

(10) Patent No.: US 6,875,975 B2
(45) Date of Patent: Apr. 5, 2005

(54) MULTI-COLOR, MULTI-FOCAL PLANE OPTICAL DETECTOR

(75) Inventors: Thomas S. Faska, Brookline, NH (US); Michael F. Taylor, Milford, NH (US); Mani Sundaram, Nashua, NH (US); Richard J. Williams, Hollis, NH (US)

(73) Assignee: Bae Systems Information and Electronic Systems Integration INC, Nashua, NH (US)

( * ) Notice: Subject to any disclaimer, the term of this patent is extended or adjusted under 35 U.S.C. 154(b) by 126 days.

(21) Appl. No.: 09/746,956

(22) Filed: Dec. 22, 2000

(65) Prior Publication Data

US 2002/0008191 A1 Jan. 24, 2002

(Under 37 CFR 1.47)

Related U.S. Application Data

(60) Provisional application No. 60/173,077, filed on Dec. 24, 1999.

(51) Int. Cl.[7] ............................................. H01L 31/042
(52) U.S. Cl. ........................ 250/214.1; 257/440; 257/21
(58) Field of Search ............................. 250/226, 214.1, 250/208.1; 356/402, 403; 257/440, 21

(56) References Cited

U.S. PATENT DOCUMENTS

| | | |
|---|---|---|
| 5,229,614 A | 7/1993 | Andersson et al. |
| 5,384,469 A | 1/1995 | Choi |
| 5,385,632 A | 1/1995 | Goossen |
| 5,539,206 A | 7/1996 | Schimert |
| 5,546,209 A | 8/1996 | Willner et al. |
| 5,552,603 A * | 9/1996 | Stokes ..................... 250/338.4 |
| 5,568,574 A | 10/1996 | Tanguay, Jr. et al. |
| 5,818,051 A | 10/1998 | Dreiske et al. |
| 5,909,303 A | 6/1999 | Trezza et al. |
| 5,959,339 A | 9/1999 | Chapman et al. |
| 6,005,262 A | 12/1999 | Cunningham et al. |
| 6,013,912 A * | 1/2000 | Pautrat et al. ............ 250/214.1 |
| 6,091,126 A * | 7/2000 | Costard et al. ............. 257/431 |
| 6,180,967 B1 * | 1/2001 | Zanatta et al. .............. 257/184 |
| 6,184,538 B1 * | 2/2001 | Bandara et al. .......... 250/338.4 |

OTHER PUBLICATIONS

Gunapala et al., 15–um 128×128 GaAs / AlxGal–xAs Quantum Well Infrared Photodetector Focal Plane Array Camera, IEEE Transactions on Electron Devices, Jan. 1997, vol. 44, No. 1, pp. 45–50.

Tidrow et al., Grating coupled multicolor quantum well infrared photodetectors, Appl. Phys. Lett., Sep. 25, 1995, vol. 67 (13), pp. 1800–1802.

Andersson et al, Grating–coupled quantum–well infrared detectors: Theory and performance, J. Appl. Phys., Apr. 01, 1992, vol. 71 (7), pp. 3600–3610.

PCT International Search Report, 7 pages.

M. Ajmone Marsan et al, Modelling Slotted Multi–Channel Ring All–Optical Networks, *IEEE*, 1997, pp. 146–153.

Marco Ajmone Marsan et al, Access Protocols for Photonic WDM Multi–Rings with Tunable Transmitters and Fixed Receivers, *SPIE*, pp. 59–72, vol. 26921.

(Continued)

*Primary Examiner*—Stephone B. Allen
(74) *Attorney, Agent, or Firm*—Maine & Asmus

(57) ABSTRACT

A semiconductor-based, photo detector device capable of simultaneously detecting two or more selected wavelengths of light on a pixel-registered basis. The device has detector layers of selected semiconductor materials of one micron or less in thickness interspersed with contact layers, each detector layer having a different light absorption to wavelength response curve. All contact layers, including detector bias voltages, have electrical contacts on the backside of the pixel for discrete pixel connection to mating connections on a suitable ROIC substrate. Among its several embodiments, there is a multi-color detector array and a single channel per pixel differential optical signal detector.

20 Claims, 4 Drawing Sheets

OTHER PUBLICATIONS

Carl Beckmann, Applications: Asynchronous Transfer Mode and Synchronous Optical Network, *Handbook of Fiber Optic Data Communication,* 1998, pp. 385–414, Academic Press.

Floyd E. Ross, An Overview of FDDI: The Fiber Distributed Data Interface, *IEEE Journal on Selected Areas in Communications,* Sep. 1989, pp. 1043–1051, vol. 7 No. 7.

Sundaram, Mani and Reisinger, Axel, Avalanche QWIP, 7 pages.

Sundaram, Mani and Reisinger, Axel, Tunable QWIP with Asymmetric Quantum Wells, 7 pages.

Sundaram, Mani and Reisinger, Axel, Bimodal QWIP with Coupled Quantum Wells, 8 pages.

Sundaram, Mani and Reisinger, Axel, Blocked Superlattice Miniband QWIP with/without GRaded Barriers, 8 pages.

Sundaram, Mani and Reisinger, Axel, Tinable Multi–Color QWIP, 7 pages.

Sundaram, Mani and Reisinger, Axel, Rotated Waffle–Grating Optical Coupler for QWIPs, 14 pages.

Sundaram, Mani and Reisinger, Axel, Hybrid Metal Optical Coupler for QWIPs, 7 pages.

Sundaram, Mani and Reisinger, Axel, Photon–In–Box QWIP, 9 pages.

\* cited by examiner

MULTI-COLOR, MULTI-FOCAL PLANE OPTICAL DETECTOR

CROSS REFERENCE TO RELATED APPLICATIONS

This application relates and claims priority to pending U.S. application Ser. No. 60/173,077 filed Dec. 24, 1999, entitled MULTI-COLOR, MULTI-FOCAL PLANE OPTICAL DETECTOR incorporated herein for all purposes.

BACKGROUND OF THE INVENTION

1. Technical Field of the Invention

The present invention relates to photonic detection and more particularly to a photo detector detecting multiple wavelengths simultaneously and connecting to a single substrate.

2. Background Art

It is often desirable in infrared and other visioning systems to be able to detect and determine, on a simultaneous and pixel-registered basis, the amount of light of two or more different wavelengths in a given field of vision. Being able to simultaneously distinguish between these wavelengths of light and to determine the relative amounts of each with a single vision system is important for such purposes as identifying a spectral signature for a given source.

Single color semiconductor detectors and detector arrays are well known in the art, such as HgCdTe type focal plane array detectors. More recently, two color pixel detectors have been introduced. Suppliers such as DRS, Raytheon, Rockwell, and Lockheed Martin will be familiar to those skilled in the art.

The following patents may provide useful context for the description that follows:

Willner et al's U.S. Pat. No. 5,546,209, entitled, "One-To-Many Simultaneous and Reconfigureable Optical Two-Dimensional Plane Interconnections Using Multiple Wavelength, Vertical Cavity, Surface-Emitting Lasers and Wavelength-Dependent Detector Planes, issued Aug. 13, 1996, involves the use of multiple semiconductor photodetector devices comprised of interband absorption materials and with different absorption spectra. These devices are integrated onto separate, optically transparent substrates, and then stacked one on top of the other to achieve multi-wavelength absorption in a pixel-registered fashion. The device uses wavelength-division-multiplexing (WDM) to facilitate simultaneous and reconfigurable communication of from one, to many, 2-D optical planes.

Schimert's U.S. Pat. No. 5,539,206, entitled "Enhanced Quantum Well Infrared Photodetector," issued Jul. 23, 1996, discloses an infrared detector array that includes a plurality of detector pixel structures, each of which has a plurality of elongate quantum well infrared radiation absorbing photoconductor (QWIP) elements. The group of QWIP elements are spaced such that they comprise a diffraction grating for the received infrared radiation. An infrared radiation reflector is provided to form an optical cavity for receiving infrared radiation. A plurality of detector pixel structures are combined to form a focal plane array. Each detector pixel structure produces a signal that is transmitted to a read out circuit. The group of the signals from the detector pixel structures produces an image corresponding to the received infrared radiation.

Choi's U.S. Pat. No. 5,384,469, entitled "Voltage-Tunable, Multicolor Infrared Detectors," issued Jan. 24, 1995, discloses a tunable radiation detector consisting of a superlattice structure with a plurality of quantum well units, each separated by a first potential barrier and each having at least two doped quantum wells separated by a second potential barrier. The wells each have a lower energy level and a higher energy level. The first potential barriers substantially impede penetration of electrons at the lower levels. The second potential barriers permit electrons at the lower levels to tunnel through, and prevent energy-level coupling between adjacent doped quantum wells. A biasing circuit is connected across the semiconductor superlattice structure. A photocurrent sensor is provided for measuring the amount of radiation absorbed by the semiconductor superlattice structure. The superlattice structure is made a part of a hot-electron transistor for providing amplification.

Dreiske's U.S. Pat. No. 5,818,051, issued Oct. 6, 1998, for a Multiple Color Infrared Detector, discloses a detector formed from a photodiode, a photoconductor, and an insulating layer of material disposed between the photodiode and the photoconductor. The photodiode detects infrared radiation in the spectral band between about 3 and 5 micrometers, and the photoconductor detects infrared radiation in the spectral band between about 8 and 13 micrometers.

Chapman's U.S. Pat. No. 5,959,339, issued Sep. 28, 1999, entitled Simultaneous Two-Wavelength P-N-P-N Infrared Detector, discloses a detector array architecture with two stacked detectors of different wavelengths per pixel, where a pair of contact points for reading the current in each of the two detectors is brought by a metalization layer to the back surface of the device for pixel discrete contact with the ROIC substrate. The current induced by the first wavelength is measured directly at the first detector contact, while the current induced by the second wavelength is calculable in ROIC as the difference between the currents measured at the respective first and second detector contacts. There is a common edge conductor applied to the deepest contact on the pixel, the contact layer closest to the face of the detector, for supplying the voltage bias for the two detectors. The conductor connects all pixels and extends to the edge of the array where it is connected to the voltage source.

The Chapman disclosure is noteworthy in its description of the construct of its FIG. 2 embodiment device; the transparent substrate being first coated with an N layer of about 11 microns, a first P layer of about 3.5 microns, an N layer of about 8.5 microns, then a capping P layer of "less than" 3.5 microns. The configuration of the backside contacts includes an intentional short between the first P layer and 2nd N layer, to avoid "an undesirable additional indium bump [or discrete pixel connection to the ROIC, which] would complicate the fabrication of the detector, and may also increase the area of the unit cell." The larger implication in this statement is representative of the problem with this type of architecture; the thickness of the device when the prior art methodology is extended to the multiple layers necessary to construct a multiple wavelength detector, is not conducive to the addition of any further backside contacts due to the depth of the wells or vias.

In summary, there is not demonstrated or anticipated in the art a multi-color, multi-focal plane optical detector in a monolithic or unitary device that can be fabricated by deposition techniques on a single substrate with a sufficient number of back side contacts suitable for direct, discrete, pixel to ROIC connection and direct current readout for each wavelength, and that can be easily scaled up to large array configurations suitable for the many applications for which such a device would be attractive.

SUMMARY OF THE INVENTION

It is an object of the invention to provide a device for the detection of multiple different bandwidths of light simultaneously on a pixel-registered basis using large-scale integration techniques, with relatively thin detector and contact layers where all supporting electrical contacts are presented in a single plane on the back side of the pixel for pixel-discrete connection to a substrate containing supporting circuitry.

It is another object of the invention to provide for simultaneous detection of light in two or more bands from the ultra-violet and visible to long-infrared portion of the spectrum within one device. It is a further object to provide such multi-wavelength optical detection capability within a single integrated circuit photo detector.

It is a yet further object to provide a single channel per pixel, dual wavelength, differential optical signal photo detector, where such a device consists of two or more layers of inter-band or quantum inter-sub band transition materials that exhibit different absorption peaks at each of two or more wavelengths.

An aspect of the invention is the vertical stacking of the two or more of these detector layers, in relatively thin layers of about one micron or less. Yet another aspect of the invention is the addition of a refractive grid etched in relief into the backside of the device to reflect incoming light through the face of the device at right angles edgewise into the detector layers for extended travel through the light sensitive mediums. Still yet another aspect is the further coating with reflective materials of the backside and edges of each pixel, and of the refractive grid, to form an open face photon box, from which little light can escape. All of these aspects contribute to the goal of perfect spatial registration of the selected wavelengths, and simultaneous integration of the detector current from each detector through discrete pixel connections of all electrical leads to the ROIC substrate. Combining these aspects give the property of perfect spatial and temporal registration of the images. This is important as it can greatly reduce the amount of subsequent image processing required.

The present invention has the advantage of being scaleable as to the number of wavelengths. That is to say that more wavelengths can be simultaneously detected by simply adding more layers of material to the device, up to the limit of the total thickness or depth of the device versus the ability to etch sufficiently deep vias and wells and to provide the metalization to bring the contact layer leads to the backside for connection to the ROIC substrate. At least four color devices are practical with current methodologies employed in accordance with the invention.

Another advantage of the present invention is the ease of fabrication and the resultant high yields. Current processes result in yields in devices that have shown 99.99% operability. Yet another advantage is that pixel-registration is an automatic outcome of the present invention. This allows for maximum use of the area impinged upon by the incoming light.

Still yet another advantage is the combination of pixel-registration and simultaneous temporal integration of the detector signals. Combining both aspects give the property of perfect spatial and temporal registration of the images. This aspect, combined with discrete pixel connections for all leads, is very important as it can greatly reduce the amount of subsequent image processing required.

Still other objects and advantages of the present invention will become readily apparent to those skilled in this art from the following detailed description, wherein we have shown and described only a preferred embodiment of the invention, simply by way of illustration of the best mode contemplated by us on carrying out the invention.

DESCRIPTION OF THE PREFERRED EMBODIMENT

Figure 1:
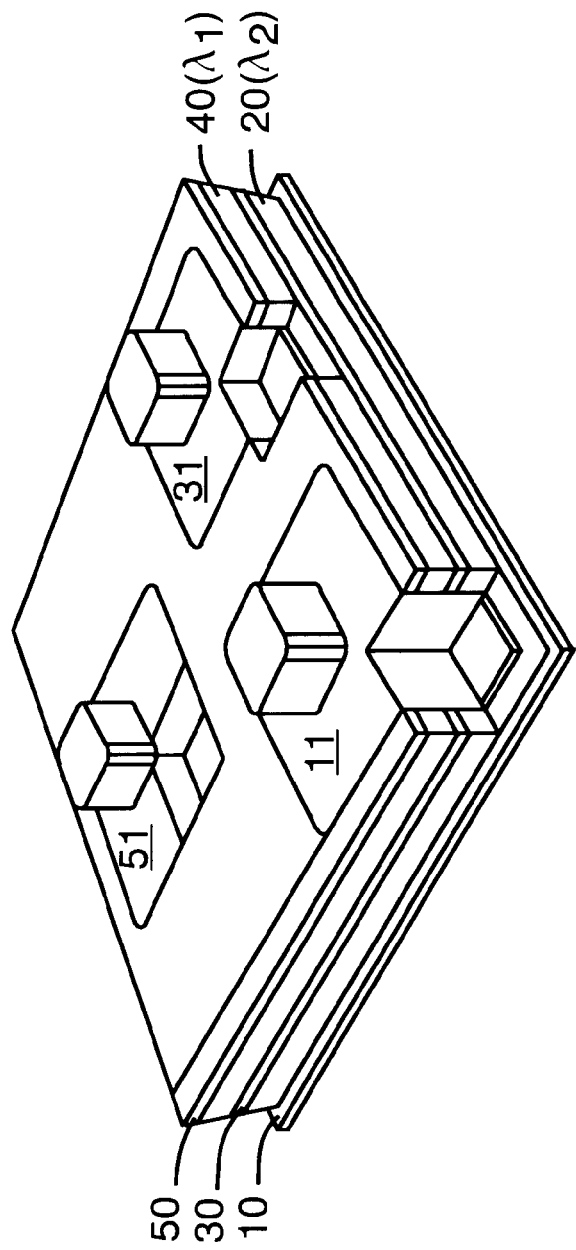
FIG. 1 is a diagrammatic, partially cut-away, perspective view of a single light detector device with multiple layers of interband materials oriented for detecting light at two different wavelengths, with backside connections for detector bias and individual detector current readouts.

The present invention is a semiconductor-based, photo detector structure capable of simultaneously detecting multiple wavelengths of light on a pixel-registered basis, and having all electrical contacts exposed. FIG. 1 contains a drawing of the invention as it would appear having been designed to detect two different wavelengths of light, $\lambda_1$ and $\lambda_2$. The apparatus is comprised of two layers 20 and 40 of detector semiconductor material each with a different light absorption spectrum, layer 40 being Detector $\lambda 1$ and layer 20 being Detector $\lambda 2$, and three layers of contact semiconductor material, contact layers 10, 30 and 50, connected metalized conductor strips to backside contacts 11, 31, and 51 respectively.

The structure is created by epitaxial growth of the various layers of semiconductor material upon a semiconductor substrate followed by selective removal of epitaxial material using an isotropic chemical etch to create the plateau-shaped device illustrated in FIG. 1. The specific semiconductor materials used depend on the specific wavelengths to be detected. Binary and ternary compounds such as GaAs and AlGaAs and quaternary compounds such as GaInAsP can be used.

As noted in the background section, vertically stacked prior art single wavelength detectors use relatively thick detector layers in order to obtain a sufficient depth of exposure or distance through which the light entering normal to the plane of the detector, so as to obtain an adequate sampling of the wavelength of interest and create a corresponding signal. In the multiple wavelength, multiple detector layer case, where the prior art methodology is extended to simply adding additional layers, the limitations in the ability to fabricate posts and vias in proportionally thicker devices led to development of the edge connector for providing the detector bias voltage.

The difficulty in providing a backside bias connection in the same plane as the detector signal contacts was overcome in several ways. The detector layers and contact layers in the preferred embodiment are each only about one micron thick, permitting the etching of vias and wells sufficiently deep to reach the contact layers but still sufficiently small in width and cross section to allow room for several contacts within the pixel surface area. As in the prior art, metal steps connect the contact layers to their backside surface pads.

Figure 2:
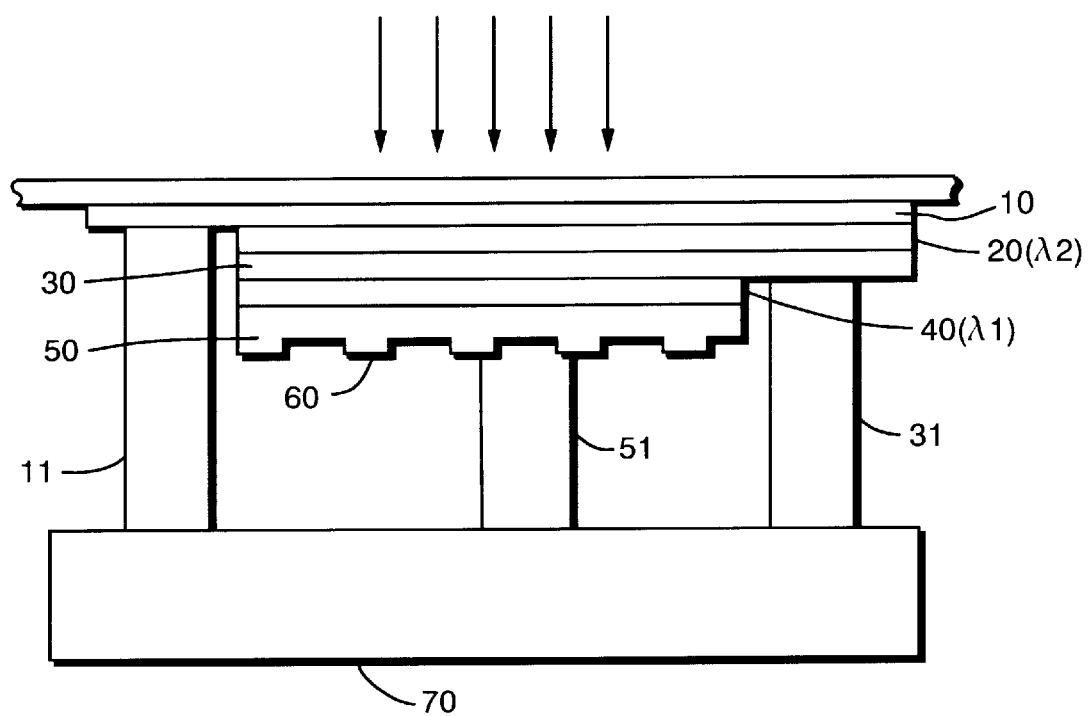
FIG. 2 is a diagrammatic, cross section view of the embodiment of FIG. 1, illustrating the contact and light detection layers, and respective Indium bump contacts as connected to an ROIC substrate.
Figure 6:
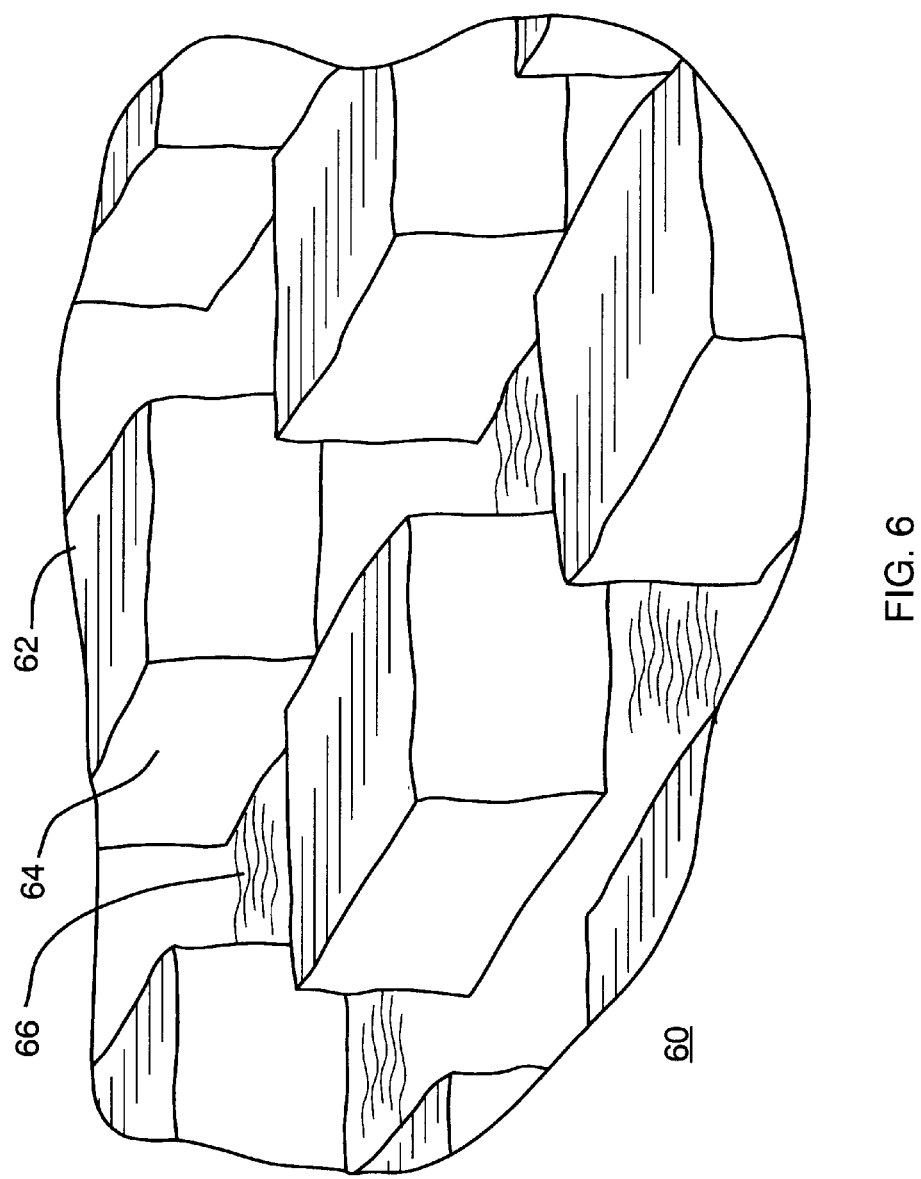
FIG. 6 is a partial perspective diagrammatic view of the refractive pattern etched into the top contact layer of the embodiment of FIG. 2.

Referring to FIGS. 2 and 6, the distance that light travels in the relatively thin detector layers of the invention is increased significantly by first etching in relief and then coating a refractive pattern 60, in the form of a grid or waffle pattern, on the top of the final or backside contact layer 50. This refractive pattern 60 reflects a substantial portion of the light coming straight into the detector in a direction normal to the path of entry, dispersing it edgewise through detector layers 20 and 40 so as to maximize the exposure of the detector layers semiconductor materials to the light. The geometry and orientation of the pattern, including the size, height, and spacing of the steps or wells of the grid, is optimized for the center wavelength of interest. The depth or relief of the etching is one quarter wavelength of the wavelength of interest; the spacing or pitch of the lines of the pattern is a wavelength in each direction.

The top or unetched portion 62 of refractive pattern 60 is first treated with an AuSnAu deposition coating for electrical bonding of a contact pad. The full pattern 60 is then coated with a gold mask, assuring that sidewalls 64 and lower, etched level 66 of the pattern is directly gold coated to achieve a smoother, more reflective quality with respect to the interior side of the coating. The AuSnAu deposition is limited to the top surface 62 where bonding is necessary, because tin (Sn) tends to permeate the surface of the semiconductor material, leaving a rough texture to the coating interface on the contact layer that degrades the reflective properties of the coating.

The pixel edges of the detector layers are likewise gold coated to reflect the refracted light vectors repeatedly back into the detector layers for maximum exposure of the detector layer material to the available light. The thin layers, refractive pattern and associated reflective coatings create in effect what one might refer to as an open face "photon box," in which light enters the face, is refracted at right angles off the backside of the box, and is hence reflected from side to side within the box.

In the preferred embodiment a simple square grid pattern 60 is used. The grid may be etched leaving the squares 62 in relief, as shown in FIG. 6, or alternatively, the squares may be etched leaving the grid lines in relief, as in a waffle pattern. The resultant surface area of each level is about equal.

The refraction effect of the square pattern on light entering the detector tends to be bi-directional, oriented with the lines of the pattern, so the pattern is preferably diagonally oriented with respect to the edges of the pixel so planar light vectors are initiated at angles other than perpendicular to the edges of the pixel. This further enhance edge reflection properties within the detector layer, bouncing the light vectors around the box rather than straight back and forth between opposing sides.

The indium bump or contact 51 for contact layer 50, the top or final contact layer, is set on squares 62, the higher or unetched level of pattern 60, the nominally 50% surface area of the unetched portion of the pattern, bridging the lower level 66 troughs or wells of the pattern. A close up view of the refractive pattern is illustrated in cross section in FIG. 2 and in partial perspective view in FIG. 6.

Referring back to FIGS. 1 and 2, the multi-wavelength detector device can be made from combinations of elements from groups II, III, IV, and V from the periodic table. Precise physical and performance characteristics depend on the exact composition of the material. Metal conductors are then deposited onto the structure to form electrical connectivity between contacts 11, 31, and 51 on the back surface of the device, and the three individual contact layers 10, 30, and 50. Contacts 11, 31, and 51 are electrically connected to their respective contact layers, but are electrically insulated from all other layers except through the two detector layers 20 and 40.

Densely packed arrays of these photo detector devices can be created on the same semiconductor substrate and then be flip-chip mounted, or hybridized, onto another substrate containing the electronic circuitry that is connected to the photo detectors through the metal contacts 11, 31 and 51, on the backside surface of each device.

Referring now to FIG. 2, there is graphically illustrated a single device in cross section after it has been hybridized onto an ROIC substrate 70 containing electronic circuitry. In operation a detector bias voltage is placed on contact 31 with respect to contacts 11 and 51. This produces an electrical bias across each detector layer. The layer composition of the two photo detecting devices have been carefully chosen so that when light of multiple wavelengths pass into the photo detector, the layers selectively absorb certain wavelengths, while remaining transparent to other wavelengths.

Figure 3:
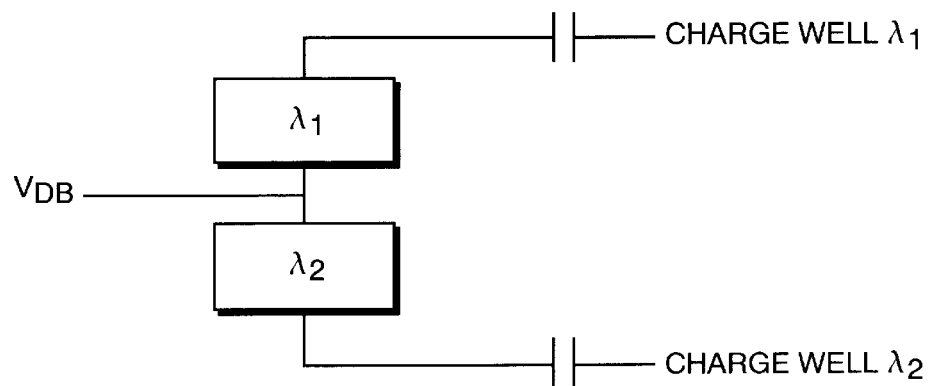
FIG. 3 is a simplified electrical schematic of the embodiment of FIG. 1, illustrating the device's ability to detect two wavelengths of light.

Absorption of the selected wavelength of light energy modulates current in the corresponding detector layer. This current can then be measured separately and simultaneously by the read out integrated circuit (ROIC) present on substrate 70. The equivalent electrical schematic of FIG. 2 is depicted in FIG. 3. A detector bias voltage $V_{db}$ is placed on node or contact 31 with respect to nodes or contacts 11 and 51. Each detector layer, 20 and 40, absorbs the particular wavelength of light for which it was designed. This absorption modulates the current passing through the detector layer caused by the applied voltage bias. The total current through each detector is separately collected by a readout integrated circuit and measured. This measured current is proportional to the amount of light absorbed by the associated detector.

In practice the ROIC substrate 70 can measure the current from one detector at a time, switching rapidly between detectors $\lambda 1$ and $\lambda 2$ to perform each measurement. However, the preferred method is to collect currents from both detectors $\lambda 1$ and $\lambda 2$ simultaneously.

The embodiment variously represented by FIGS. 1, 2, and 3, has been designed to detect two wavelengths of light, $\lambda 1$ and $\lambda 2$, but it is understood that it is within the scope of the invention to build devices that can detect several wavelengths simultaneously using the methodology described here. In particular, the two layer embodiment can be increased by adding layers and backside contacts to accommodate at least four discrete detector layers within each pixel.

Figure 4:
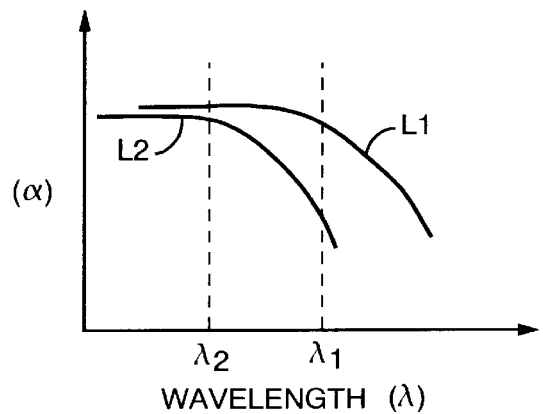
FIG. 4 is a graph of the absorption coefficient versus wavelength for the detection layers of the embodiment of FIG. 1.

There are two general types of absorption spectra seen in the materials that can be used to produce the photo detectors of the present invention as shown in FIG. 2. First, for interband materials, such as GaAs, InSb, and HgCdTe, which are typically designed for the detection of near, mid- and long-wave infrared radiation, respectively. The relative absorption spectra for these materials appear as shown in FIG. 4. The two curves L2 and L1, represent the absorption coefficients as a function of wavelength ($\lambda$) of the materials contained in contact layers 2 and 1 shown in FIG. 1. In general, each curve shows a region of high absorption at shorter wavelengths $\lambda_2$, while at longer wavelengths $\lambda_1$, the absorption diminishes.

To build a multi-color detector out of this type of material requires that the absorption spectra center around the wavelengths of light for which detection is desired, here assumed to be $\lambda_1$ and $\lambda_2$. This selection ensures efficient absorption of light at the selected wavelengths. In the this example, contact layer 10 of FIG. 1 would be used to detect $\lambda_2$ and contact layer 50 would be used to detect $\lambda_1$. In addition, the materials must be layered in the detector in an order such that light passes through detector layer 20 first and then into detector layer 40. The reason for this is that since the absorption spectrum for the material of layer 40 contains a region of high absorption that includes $\lambda_2$, it would incorrectly filter $\lambda_2$ along with $\lambda_1$ if it were placed first in the path of incoming light.

Figure 5:
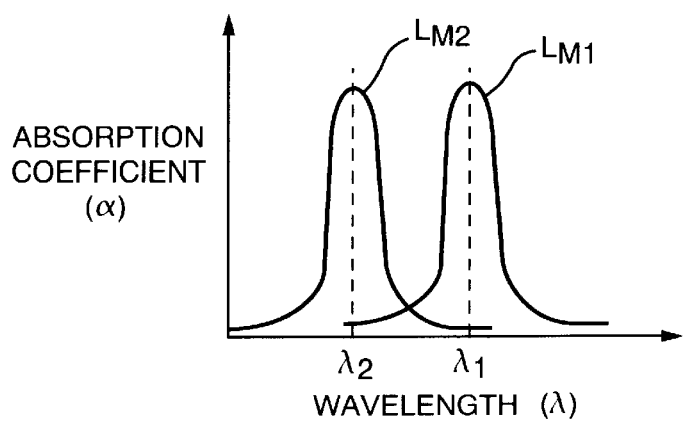
FIG. 5 is a graph of the absorption coefficient versus wavelength for two different detection layers fabricated of quantum-well inter-sub band materials.

The second type of absorption spectrum is one seen in quantum-well inter-sub band materials, such as GaAs/AlGaAs, AlGaAs/InGaAs, designed to detect mid- and far-infrared wavelengths. FIG. 5 shows schematic representations of the absorption curves $L_{M2}$ and $L_{M1}$ for any two different quantum-well, inter-subband materials M2 and M1. Note that these spectra do not overlap each other in their respective $\lambda_2$ and $\lambda_1$ regions of high absorption. When two such materials are used to create the multicolor photo detector of the present invention, then it is not be necessary to form the structure with the layer sequencing constraint necessary with interband absorption materials.

The invention lends itself to numerous potential applications. With an array of dual-wavelength, photo detectors, a network interconnect can be created whereby one wavelength transmits the data value while the other wavelength transmits the inverted data value. In this way, a differential optical signal can be transmitted, improving noise margin and extending the physical range of optical interconnects.

Another area of application for this invention is in vision system applications where pixel-registered images in multiple wavelengths are useful, including weapons targeting, chemical analysis, medical imaging and diagnostics.

The methodology described here differs from current conventional methods by depositing very thin detector layers, stacking the layers vertically on top of each other, by applying a refractive grid finish to the backside contact layer and a further reflective finish to the backside and edges to create the proton box, and by bringing the bias contact as well as the readout contacts to the backside surface of the pixel for mating to the ROIC substrate as with flip-chip or other bonding techniques. Some other methods utilize a common edge conductor on the contact layer furthest from the backside, for bias voltage, where the common connector extends across adjacent pixels to the edge of the array for connection to a bias voltage source. This lacks the advantage of a discrete pixel bias voltage connection and a common, one step fabrication process for making all necessary connections to the detector array.

Other methods for creating multi-wavelength detectors, organize the detector elements side by side in the same plane within a pixel. This simplifies the detector fabrication but requires more physical space and/or small detectors. Vertically stacking relatively thin detector layers in order of transparency, and using the refractive grid and associated "photon box" techniques, allows each detector the maximum exposure area to the incoming light. This improves the detector fill factor, here defined as the active optical detector area divided by the total area, and also the detector performance. Also, with data from a given pixel collected at the same time for each color, combined with discrete pixel bias control, there is the potential for doing complex data processing at each pixel site, advancing the integration of sensing and processing power yet another finite step.

As will be realized, the invention is capable of other and different embodiments, and its several details are capable of modifications in various obvious respects, all without departing from the invention. For example, there is within the scope of the invention a multi-wavelength, pixel-registered photo detector array with a multiplicity of detector layers of semiconductor material interspersed between contact layers of semiconductor material, where each said detector layer has a different light absorption versus wavelength response curve, and each detector layer is not more than about one micron in thickness.

Each pixel of the detector array may have a transparent face and a back side, where the backsides are all in a common plane to accommodate connection to a planar ROIC substrate. In furtherance of that connection, each contact layer of each pixel may have a discrete electrical contact on the backside of the pixel, so that all the contacts are connectable to mating contacts on the planar substrate containing ROIC and other supporting electrical circuitry.

One contact layer of each pixel is always the final or capping contact layer that forms the back side, or is more likely proximate the backside of the pixel due to having been coated all or partially, as is known in the art, to insulate, reflect, or provide bumps or contacts and conduct leads to lower level contact layers. The outer surface of this final or capping contact layer may be etched in relief with a refractive lightwave pattern for reflecting light entering the pixel normal to the transparent face, at substantially right angles so as to be dispersed edgewise into the detector layers.

The refractive lightwave pattern may be a grid of lines and squares, the pitch of the squares being one wavelength of the center frequency of interest, the area of the grid lines being about equal to the area of the squares. The grid pattern may be oriented diagonally with respect to the major edges of the pixel so that the refracted light is directed towards the edges at other than a right angle. Either the lines or the squares of the pattern may be etched, the etching being done to a depth about one quarter wavelength of the center frequency of interest.

The top or final contact layer and the edges of the detector layers of each pixel may be reflectively coated for containing light within the pixel by reflecting it endlessly from edge to edge within the plane of the detector layers.

The semiconductor material of the detector layers may be interband materials, where the detector layers are deposited in order from top to bottom of the photo detector by their respective response curves for detecting from longer to shorter wavelengths of light. The interband materials may consist of at least a binary compound of elements from among Groups II, III, IV, and V from the periodic table, such as GaAs, AlGaAs, and GaInAsP.

Alternatively, the semiconductor materials may be quantum-well inter-sub band materials, from among Groups II, III, IV, and V from the periodic table, such as compounds like GaAs/AlGaAs and AlGaAs/InGaAs.

As another example, there is within the scope of the invention a single channel differential optical signal detector that consists of a multiple wavelength semiconductor photo detector or pixel having a multiplicity of detector layers of semiconductor material interspersed between contact layers of semiconductor material, where each detector layer has a different light absorption versus wavelength response curve, and each detector layer is not more than about one micron in thickness. The detector has a transparent face into which light is directed, and a back side. Each contact layer has a discrete electrical contact on the backside, to which it is connected by a metal step down strip applied in the usual manner, so that all the contacts, including the voltage bias contacts, are connectable to mating contacts on a substrate having supporting integrated circuitry.

One contact layer is a final or top contact layer proximate the back side of the detector. The exposed or outside surface of the final contact layer is etched in relief with a refractive lightwave pattern that is configured for reflecting light entering the pixel normal to its face, at substantially right angles so as to be dispersed edgewise into the detector layers, and parallel with the face and backside of the pixel. The refractive lightwave pattern may consist of a grid of lines and squares, and be applied as described in other embodiments. The final contact layer and edges of the detector layers of the detector may be reflectively coated for containing light as described in other embodiments. The detector in this embodiment may be a pixel in a two-dimensional array of pixel-registered two wavelength semiconductor photo detectors.

As yet another example, the invention is embodied in a multi channel differential optical signal detector device consisting of a multiple wavelength pixel-registered semiconductor photo detector array, where each pixel thereof has at least two detector layers of semiconductor material interspersed between at least three contact layers of semiconductor material. Each detector layer has a different light absorption versus wavelength response curve. Each detector layer is not more than about one micron in thickness. Each pixel has a transparent face that is optically connected to a single signal channel or fiber for admitting light signals. Each contact layer of each pixel may have a discrete electrical contact on its backside, and all the contacts of each pixel may be connectable to mating contacts on a substrate having supporting integrated circuitry.

One of the contact layers of each pixel is the final or top layer proximate the back side of the pixel. The outer side or surface of the final contact layer may be etched in relief with a refractive lightwave pattern as described in other embodiments. The final or top contact layer and edges of the detector layers of each pixel may be reflectively coated as described in other embodiments.

The objects and advantages of the invention may be further realized and attained by means of the instrumentalities and combinations particularly pointed out in the appended claims.

We claim:

1. A multi-wavelength pixel-registered photo detector array comprising
    a multiplicity of detector layers of semiconductor material interspersed between contact layers of semiconductor material so as to have a transparent face and a backside,
    each said detector layer having a different light absorption versus wavelength response curve,
    each said detector layer being not more than about one micron in thickness,
    one said contact layer of each said pixel being a final contact layer proximate said backside,
    the outer side of said final contact layer being etched in relief with a refractive lightwave pattern,
    said refractive lightwave pattern configured for reflecting light entering said pixel normal to said transparent face at substantially right angles so as to be dispersed edgewise into said detector layers,
    said final contact layer and edges of said detector layers of each said pixel being reflectively coated for containing light within said pixel,
    said semiconductor materials being quantum-well inter-sub band materials.

2. A multi-wavelength pixel-registered photo detector array according to claim 1,
    each pixel of said detector array having a transparent face and a back side,
    said backsides of all said pixels having a common plane,
    each said contact layer of each said pixel having an electrical connection to a respective electrical contact on said backside,
    all said contacts being connectable to mating contacts on a planar substrate containing supporting electrical circuitry.

3. A multi-wavelength pixel-registered photo detector array comprising
    a multiplicity of detector layers of semiconductor material interspersed between contact layers of semiconductor material so as to have a transparent face and a backside,
    each said detector layer having a different light absorption versus wavelength response curve,
    each said detector layer being not more than about one micron in thickness,
    one said contact layer of each said pixel being a final contact layer proximate said backside,
    the outer side of said final contact layer being etched in relief with a refractive lightwave pattern,
    said refractive lightwave pattern comprising a grid of lines and squares,
    the pitch of said squares being one wavelength,
    the area of said lines being substantially equal to the area of said squares,
    said grid being oriented diagonally to the major edges of said pixel,
    either of said lines and said squares being etched to a depth about one quarter wavelength,
    said final contact layer and edges of said detector layers of each said pixel being reflectively coated for containing light within said pixel,
    said semiconductor materials of said detector layers being interband materials,
    said detector layers being ordered from top to bottom of said photo detector by respective said response curves for detecting from longer to shorter wavelengths of light.

4. A multi-wavelength pixel-registered photo detector array according to claim 3,
    each pixel of said detector array having a transparent face and a back side,
    said backsides of all said pixels having a common plane,
    each said contact layer of each said pixel having an electrical connection to a respective electrical contact on said backside,
    all said contacts being connectable to mating contacts on a planar substrate containing supporting electrical circuitry.

5. A multi-wavelength pixel-registered photo detector array comprising
    a multiplicity of detector layers of semiconductor material interspersed between contact layers of semiconductor material so as to have a transparent face and a backside,
    each said detector layer having a different light absorption versus wavelength response curve,
    each said detector layer being not more than about one micron in thickness, each pixel of said detector array having a transparent face and a back side, said backsides of all said pixels having a common plane, each said contact layer of each said pixel having an electrical connection to a respective discrete electrical contact on said backside, all said contacts being connectable to mating contacts on a planar substrate containing supporting electrical circuitry.

6. A multi-wavelength pixel-registered photo detector array according to claim 5, one said contact layer of each said pixel being a final contact layer proximate said backside, the outer side of said final contact layer being etched in relief with a refractive lightwave pattern, said refractive lightwave pattern configured for reflecting light entering said pixel normal to said transparent face at substantially right angles so as to be dispersed edgewise into said detector layers, said final contact layer and edges of said detector layers of each said pixel being reflectively coated for containing light within said pixel.

7. A multi-wavelength pixel-registered photo detector array according to claim 6, said refractive lightwave pattern comprising a grid of lines and squares, the pitch of said squares being one wavelength, the area of said lines being substantially equal to the area of said squares, said grid being oriented diagonally to the major edges of said pixel, either of said lines and said squares being etched to a depth about one quarter wavelength.

8. A multi-wavelength pixel-registered photo detector array according to claim 5, said semiconductor materials of said detector layers being interband materials, said detector layers being ordered from top to bottom of said photo detector by respective said response curves for detecting from longer to shorter wavelengths of light, said interband materials comprising at least a binary compound consisting of elements from among Groups II, III, IV, and V from the periodic table.

9. A multi-wavelength pixel-registered photo detector according to claim 8, said compound comprising at least one compound from among the group of compounds consisting of GaAs, AlGaAs, and GaInAsP.

10. A multi-wavelength pixel-registered photo detector according to claim 5, said semiconductor materials being quantum-well inter-sub band materials.

11. A multi-wavelength pixel-registered photo detector according to claim 9, said quantum-well inter-sub band materials comprising a compound consisting of elements from among Groups II, III, IV, and V from the periodic table.

12. A multi-wavelength pixel-registered photo detector according to claim 11, said compound comprising at least one compound from among the group of compounds consisting of GaAs/AlGaAs and AlGaAs/InGaAs.

13. A single channel differential optical signal detector comprising a multiple wavelength semiconductor photo detector having a multiplicity of detector layers of semiconductor material interspersed between contact layers of semiconductor material, each said detector layer having a different light absorption versus wavelength response curve, each said detector layer being not more than about one micron in thickness, said detector having a transparent face and a back side, each said contact layer having a discrete electrical contact on said backside, all said contacts being connectable to mating contacts on a substrate having supporting integrated circuitry.

14. A single channel differential optical signal detector according to claim 13, one said contact layer being a final contact layer proximate said back side, the outer side of said final contact layer being etched in relief with a refractive lightwave pattern, said refractive lightwave pattern configured for reflecting light entering said pixel normal to said transparent face at substantially right angles so as to be dispersed edgewise into said detector layers.

15. A single channel differential optical signal detector according to claim 14, said refractive lightwave pattern comprising a grid of lines and squares, the pitch of said squares being one wavelength, the area of said lines being substantially equal to the area of said squares, said grid being oriented diagonally to the major edges of said detector, either of said lines and said squares being etched to a depth of about one quarter wavelength, said final contact layer and edges of said detector layers of said detector being reflectively coated for containing light within said pixel.

16. A single channel differential optical signal detector according to claim 15, said detector being one of a two-dimensional array of pixel-registered two wavelength semiconductor photo detectors.

17. A multi channel differential optical signal detector device comprising a multiple wavelength pixel-registered semiconductor photo detector array, each pixel thereof having at least two detector layers of semiconductor material interspersed between at least three contact layers of semiconductor material, each said detector layer having a different light absorption versus wavelength response curve, each said detector layer being not more than about one micron in thickness, each said pixel having a transparent face and a back side, said transparent face being optically connected to a signal channel, each said contact layer having a discrete electrical contact on said backside, all said contacts being connectable to mating contacts on a substrate having supporting integrated circuitry.

18. A multi channel differential optical signal detector device according to claim 17, one said contact layer of each said pixel being a final contact layer proximate said back side, the outer side of said final contact layer being etched in relief with a refractive lightwave pattern, said refractive lightwave pattern configured for reflecting light entering said pixel normal to said transparent face at substantially right angles so as to be dispersed edgewise into said detector layers.

19. A multi channel differential optical signal detector device according to claim 18, said refractive lightwave pattern comprising a grid of lines and squares, the pitch of said squares being one wavelength, the area of said lines being substantially equal to the area of said squares, said grid being oriented diagonally to the major edges of said pixel, either of said lines and said squares being etched to a depth about one quarter wavelength.

20. A multi channel differential optical signal detector device according to claim 18, said final contact layer and edges of said detector layers of said detector being reflectively coated for containing light within said pixel.

* * * * *